United States Patent [19]

Paz De Araujo et al.

[11] Patent Number: 5,648,114
[45] Date of Patent: Jul. 15, 1997

[54] CHEMICAL VAPOR DEPOSITION PROCESS FOR FABRICATING LAYERED SUPERLATTICE MATERIALS

[75] Inventors: Carlos A. Paz De Araujo, Colorado Springs, Colo.; Hitoshi Watanabe, Tokyo, Japan; Michael C. Scott, Colorado Springs, Colo.; Takashi Mihara, Saitama, Japan

[73] Assignees: Symetrix Corporation, Colorado Springs, Colo.; Olympus Optical Co., Ltd., Tokyo, Japan

[21] Appl. No.: 90,767

[22] Filed: Jul. 12, 1993

Related U.S. Application Data

[63] Continuation-in-part of Ser. No. 981,133, Nov. 24, 1992, Pat. No. 5,423,285, and Ser. No. 965,190, Oct. 23, 1992, abandoned, each is a continuation-in-part of Ser. No.807, 439, Dec. 13, 1991, abandoned.

[51] Int. Cl.$^6$ ............................. B05D 5/12; C23C 16/00; C30B 28/14
[52] U.S. Cl. ............................ 427/126.3; 427/255.3; 427/314; 427/376.2; 427/372.2; 117/94; 117/104; 117/88; 437/225
[58] Field of Search ................... 427/529, 523, 427/126.3, 255.3, 377, 376.2, 372.2, 554, 555, 559, 654, 676, 584, 585, 314; 437/225; 117/90, 92, 94, 101, 103, 108, 106, 104, 949

[56] References Cited

U.S. PATENT DOCUMENTS

| | | | |
|---|---|---|---|
| 4,792,463 | 12/1988 | Okada et al. | 427/126.3 |
| 4,912,087 | 3/1990 | Aslam et al. | 427/126.3 |
| 4,965,090 | 10/1990 | Gärtner et al. | 427/569 |
| 5,006,363 | 4/1991 | Fujii et al. | 427/126.3 |
| 5,043,049 | 8/1991 | Takenaka | 204/192.15 |
| 5,138,520 | 8/1992 | McMillan et al. | 427/565 |
| 5,141,917 | 8/1992 | Tanaka et al. | 427/126.3 |
| 5,146,299 | 9/1992 | Lampe, et al. | 357/23.5 |
| 5,174,926 | 12/1992 | Sahagen | 252/521 |
| 5,206,213 | 4/1993 | Cuomo et al. | 422/576 |
| 5,206,778 | 4/1993 | Larson et al. | 361/313 |
| 5,216,572 | 6/1993 | Larson et al. | 361/313 |
| 5,254,530 | 10/1993 | Sugimoto et al. | 427/126.3 |
| 5,258,204 | 11/1993 | Wernberg et al. | 427/126.3 |
| 5,260,265 | 11/1993 | Yamazaki | 427/126.3 |
| 5,262,396 | 11/1993 | Yamazaki | 427/576 |
| 5,276,010 | 1/1994 | Sasaki | 427/126.3 |
| 5,278,138 | 1/1994 | Ott et al. | 427/126.3 |
| 5,310,990 | 5/1994 | Russell et al. | 219/121.69 |
| 5,338,951 | 8/1994 | Argos, Jr. et al. | 257/295 |
| 5,374,578 | 12/1994 | Patel et al. | 437/52 |
| 5,391,393 | 2/1995 | Maniar | 427/126.2 |
| 5,401,680 | 3/1995 | Abt et al. | 437/60 |
| 5,406,510 | 4/1995 | Mihara et al. | 365/145 |
| 5,439,845 | 8/1995 | Watanake et al. | 427/126.3 |
| 5,478,610 | 12/1995 | Desu et al. | 427/573 |
| 5,527,567 | 6/1996 | Desu et al. | 427/573 |

OTHER PUBLICATIONS

Lathrop et al "Production of $YBa_2Cu_3O_{7-y}$ Supercond. Thin Films in Situ by High–Pressure Reactive Evaporation and Rapid Thermal Annealing", *Appl. Phys. Lett*, 51(19), 9 Nov. 1987, pp. 1554–1556.

Yamane et al,"Preparation of Bi–Sr–Ca–Cu–O Films by Chemical Vapor Dep. with Metal Chelate and Alkoxide", *Chemistry Letters*, 1988 (no month) The Chemical Society of Japan, pp. 1515–1516.

(List continued on next page.)

*Primary Examiner*—Marianne Padgett
*Attorney, Agent, or Firm*—Duft, Graziano & Forest, P.C.

[57] ABSTRACT

A substrate is prebaked in an oxygen furnace. A thin film of layered superlattice oxide is formed on the substrate by a chemical vapor deposition process. The film is RTP baked to provide grains with a mixed phase of A-axis and C-axis orientation. The film may be treated by ion implantation prior to the RTP bake and oxygen furnace annealed after the RTP bake. An electrode is deposited on the layered superlattice thin film and then the film and electrode are oxygen furnace annealed.

16 Claims, 4 Drawing Sheets

OTHER PUBLICATIONS

E.M. Purcell *Electricity & Magnetism: Berkeley Physics Course–vol. 2*, McGraw–Hill Book Co., 1965 (no month)–excerpt pp. 128 & 299.

R.C.Weast, ed. *CRC Handbook of Chem. & Phys*, 56th ed. 1975(no month), excerpt –p. E–60.

L.A. Wills, et al.; Deposition of Ferroelectric $Bi_4Ti_3O_{12}$ Thin Films; Extended Abstracts, vol. 90, No. 2, Feb. 1990; p. 781.

P. C. Joshi, et al.; Rapid Thermally Processed Ferroelectric $Bi_4Ti_3O_{12}$ Thin Films; *Journal of Applied Physics*, Dec., 1992, No. 11; pp. 5517–5519.

Takuma Katayama, et al.; "Photo–CVD of Ferroelectric $Pb(Zr,Ti)O_3$ Thin Films" no date, no journal.

G.A. Smolenskii, et al.; *Ferroelectrics and Related Materials;* vol. 3 of a Series of Books, Chapter 15 no date.

G.A. Smolenskii, et al.; "Ferroelectrics of the Oxygen–Octahedral Type With Layered Structure"; *Soviet Physics–Solid State*, vol. 3, No. 3; Sep. 1961.

E.C. Subbarao; "Ferroelectricity in Mixed Bismuth Oxides With Layer–Type Structure"; 1960 no Journal no month.

J. Gopalakrishnan, et al.; "A Homologous Series of Reccurent Intergrowth Structures of the Type $Bi_4A_{m+n-2}B_{m+n}O_{3(m+n)+6}$ Formed by Oxides of the Aurivillius Family"; *Journal of Solid State Chemistry* 55, 101–105; 1984 no month.

P.C. Joshi, et al.; "Structural and optical properties of ferroelectric $Bi_4Ti_3O_{12}$ thin films by sol–gel technique–";published Nov. 1991 no Journal.

Shu–Yau Wu; "A New Ferroelectric Memory Device, Metal–Ferroelectic–Semiconductor Transistor"; *IEEE Transactions on Electron Devices*, vol. ED.–21, No. 8; Aug. 1974.

B.S. Kwak, et al.; "Metalorganic chemical vapor deposition of $PbTiO_3$ thin films"; *Appl. Phys. Lett.* 53; Oct. 31, 1988.

Takashi Nakamura, et al.; "Preparation of $Bi_4Ti_3O_{12}$ Thin Film by MOCVD"; May 1993 Jap.–no trans.

Masaru Shimizu, et al.; "Preparation of $PbTiO_3$ Thin Films by Photo–MOCVD"; Sep. 1992 no Journal.

Takuma Katayama, et al.; Photo–MOCVD of $PbTiO_3$ thin films; *Journal of Crystal Growth;* 1991 (no month) vol. 115 pp. 289–293.

Takuma Katayama, et al.; "Growth and Properties of $PbTiO_3$ Thin Films by Photoenhanced Chemical Vapor Deposition"; *Japanese Journal of Applied Physics*, Sep. 1991; vol. 30, No. 9B, p. 2189–2192.

M.J. Cooke; *Semiconductor Devices;* 1990; Prentice Hall pp. 196–198.

Masaru Shimizu et al.; "Compositional Control of Ferroelectric $Pb(Zr,Ti)O_3$ Thin Films By Reactive Sputtering and MOCVD" no date, no Journal.

Takashi Nakamura, et al.; Preparation of C–Axis–Oriented $Bi_4Ti_3O_{12}$ Thin Films by Metalorganic Chemical Vapor Deposition; Sep. 1993; Jpn. J. Appl. Phys. vol. 32 (1993) pp. 4086–4088, Part 1, No. 9B.

P.C. Van Buskirk, et al.; MOCVD Growth of $BaTiO_3$ in an 8" Single–Wafer CVD Reactor; 8th Int. Symp. Appl. Ferro. Proc., Greenville, SC, Sep. 1992.

C.J. Brierley, et al.; The Growth of Ferroelectric Oxides by MOCVD; Ferroelectrics, 1989, vol. 91, pp. 181–192 no month.

Gregory T. Stauf, et al.; Buffer Layers for Ferroelectric–Based Infra–Red Detectors on Si Grown by a Novel CVD Method; 1993 Spring MRS; Apr. 13–16, San Francisco.

Jiming Zhang, et al.; Single Liquid Source Plasma Enhanced Metalorganic Chemical Vapor Deposition of High–Quality $YBa_2Cu_3O_{7-x}$ Thin Films; App. Phys. Lett.; 61, 2884; 1992 (month not given, but after Jul.).

Jiming Zhang, et al.; Plasma Enhanced Metalorganic Chemical Vapor Deposition of Conductive Oxide Electrodes for Ferroelectric $BaTiO_3$ Capacitors; Materials Research Society Symposium Proceedings, vol. 310, pp. 249–254 1993, no month.

CHEMICAL VAPOR DEPOSITION PROCESS FOR FABRICATING LAYERED SUPERLATTICE MATERIALS

This application is a continuation-in-part of U.S. patent application Ser. No. 07/981,133 filed Nov. 24, 1992 now U.S. Pat. No. 5,423,285 issued Jun. 13, 1995 and Ser. No. 07/965,190 filed Oct. 23, 1992 now abandoned which in turn are continuations-in-part of U.S. patent application Ser. No. 07/807,439 filed Dec. 13, 1991 now abandoned.

BACKGROUND OF THE INVENTION

1. Field of the Invention

The invention in general relates to the fabrication of layered superlattice materials, and more particularly to a chemical vapor deposition process especially useful for making layered superlattice oxides and precursors for the chemical vapor deposition process that may be used in making the layered superlattice oxides as well as other layered superlattice materials.

2. Statement of the Problem

Copending U.S. patent application Ser. No. 07/965,190 filed Oct. 23, 1992 now abandoned discloses that the layered superlattice materials discovered by G. A. Smolenskii, V. A. Isupov, and A. I. Agranovskaya (See Chapter 15 of the book, *Ferroelectrics and Related Materials*, ISSN 0275-9608, [V.3 of the series Ferroelectrics and Related Phenomena, 1984] edited by G. A. Smolenskii, especially sections 15.3–15) are far better suited for ferroelectric and high dielectric constant integrated circuit applications than any prior materials used for these applications. The application discloses that the layered superlattice materials spontaneously form layered superlattices, i.e. crystalline lattices that include alternating layers of distinctly different sublattices, such as ferroelectric and non-ferroelectric sublattices, and that the layered nature gives rise to significant properties, such as extremely low fatigue ferroelectrics. The layered superlattice oxides comprise complex oxides of metals, such as strontium, calcium, barium, bismuth, cadmium, lead, titanium, tantalum, hafnium, tungsten, niobium, zirconium, bismuth, scandium, yttrium, lanthanum and the lanthanides, antimony, chromium, molybdenum, vanadium, ruthenium, and thallium. Generally, each layered superlattice material will include two or more of the above metals; for example, strontium, bismuth and tantalum form the layered superlattice material strontium bismuth tantalate, $SrBi_2Ta_2O_9$.

Numerous methods of fabricating the layered superlattice oxides are known. For example powders of the oxides or salts of the constituent metals may be mixed, pressed, and sintered at high temperature. See G. A. Smolenskii, V. A. Isupov, A. I. Agranovskaya, "Ferroelectrics of the Oxygen-Octahedral Type With Layered Structure ", *Soviet Physics—Solid State*, V. 3, No. 3, pp. 651–655(September 1961). Or solid oxides and/or carbonates of the constituent metals may be reacted at high temperature. See E. C. Subbarao, "Ferroelectricity in Mixed Bismuth Oxides With Layer-Type Structure", *J. Chem. Physics*, V. 34, 695 (1961) and J. Gopalakrishnan, A. Ramanan, C. N. R. Rao, D. A. Jefferson, and David J. Smith, "A Homologous Series of Recurrent Intergrowth Structures of the Type $Bi_4A_{m+n-2}B_{m+n}O_{3(m+n)+6}$ Formed by Oxides of the Aurivillius Family, *Journal of Solid State Chemistry*, Vol. 55, pp. 101–105 (1984). One layered superlattice oxide, bismuth titanate ($Bi_4Ti_3O_2$), has been formed by RF sputtering, pulsed laser deposition, electron cyclotron resonance plasma sputtering, rapid quenching, and spinning of a sol-gel precursor onto a substrate followed by hydrolysis and heating. See P. C. Joshi, Abhai Mansingh, M. N. Kamalasanan, and Subhas Chandra, "Structural and Optical Properties of Ferroelectric Thin Films By Sol-gel Technique, "*Appl. Phys. Lett.*, Vol 59, No. 10, November 91., Shu-Yau Wu, "A New Ferroelectric Memory Device, Metal-Ferroelectric-Semiconductor Transistor", *IEEE Transactions On Electron Devices*, August 1974, pp. 499–504, U.S. Pat. No. 5,146,299 issued to Donald R. Lampe et al. The Lampe patent also discloses fabricating a number of fluoride compounds that are layered superlattice materials (but not layered superlattice oxides) by using chemical vapor deposition with β-diketonates and hydrogen fluoride used as precursors. However, Lampe does not recognize that the fluorides fabricated are layered superlattice materials, or even that they are related to bismuth titanate in any way except that all are ferroelectrics. Copending U.S. patent application Ser. No. 07/981,133, describes a method of fabricating layered superlattice materials in which each constituent metal is reacted to form a metal-carboxylate or metal-alkoxide, which metal carboxylates and/or metal-alkoxides are dissolved in a common solvent to form a precursor liquid; the precursor liquid is applied to a substrate by spinning, misting, or other application process followed by drying and annealing to form a solid thin film.

Chemical vapor deposition (CVD) is a well-known method of forming the layers in integrated circuits. See for example, M. J. Cooke, *Semiconductor Devices*, Prentice Hall, New York, N.Y. pp. 196–198, (1990). In particular simple metal oxides of the form $ABO_3$ have been formed using a organic precursors. See for example, "Metalorganic Chemical Vapor Deposition of $PbTiO_3$ Thin Films", by B. S. Kwak, E. P. Boyd, and A. Erbil, *Applied Physics Letters*, Vol. 53, No. 18, Oct. 31, 1988, pp. 1702–1704, Takuma Katayama, Masashi Fujimoto, Masaru Shimizu, and Tadashi Shiosaki, "Growth and Properties of $PbTiO_3$ Thin Films Photoenhanced Chemical Vapor Deposition", *Japanese Journal of Applied Physics*, Vol. 30, No. 9B, September 1991, pp. 2189–2192, and "Photo-MOCVD of $PbTiO_3$ Thin Films ",*Journal of Crystal Growth*, 115 (1991) 289–293, by the same authors. However, the use of CVD has not been reported for any layered superlattice oxide prior to the present invention. It is noted that in the one other disclosure that disclosed the use of CVD for layered superlattice materials, i.e. layered superlattice fluorides, the Lampe et al. patent referenced above, sputtering is recommended as the deposition process for the only layered superlattice oxide, bismuth titanate, discussed. Further the bismuth titanate formed is stated to be of a C-axis orientation which does not provide good ferroelectric properties as compared to an A-axis oriented layered superlattice material.

The fabrication process utilizing liquid or misted precursors disclosed in copending U.S. Pat. No. 5,423,285, provides layered superlattice materials with excellent properties. However, it requires that a common solvent be available in which a compound of each of the constituent metals in a given layered superlattice material is soluble. On the other hand, the CVD processes of the prior art do not provide good electrical properties even for the simple $ABO_3$ type oxides. Thus it would be highly desirable to have a fabrication process that did not require a common solvent and at the same time results in an axis orientation which provides good electrical properties.

3. Solution to the Problem

The present invention solves the above problem by providing a CVD process of fabricating layered superlattice materials, and in particular, layered superlattice oxides, that results in small grains having mixed orientation and good electrical properties.

The invention also provides a method of fabricating an integrated circuit having at least one layered superlattice thin film deposited by a CVD process. Preferably the integrated circuit is a non-volatile memory.

The invention provides a method of making a CVD precursor utilizing methoxides, ethoxides, butoxides, propoxides and other compounds with which CVD precursors may be made for almost any layered superlattice material. The deposition preferably takes place on a substrate at between 400° C. and 800° C. This produces an amorphous or polycrystalline phase with relatively small grain boundaries.

The invention provides for a crystallization or recrystallization step after the layered superlattice thin film is formed in the CVD process. Preferably the thin film is crystallized or recrystallized in a rapid thermal processing (RTP) step. Preferably, the temperature is ramped over a range of from 1° C. per second to 300° C. per second and up to a temperature of from 500° C. to 850° C. for a holding period of from 5 seconds to 5 minutes. Alternatively, an oxygen furnace anneal may be used in place of or in combination with the RTP step.

The invention provides for depositing an electrode or contact on the layered superlattice material, followed by an oxygen furnace anneal at from 600° C. to 850° C. for a period of 15 minutes or more.

The invention also optionally provides for an ion implantation step after the formation of the layered superlattice thin film and prior to the RTP step. This ion implantation step creates ion damage on the surface which provides a large number of crystallization nucleation points of different orientations.

Preferably each of the heating steps, i.e. the CVD process, the RTP, and the anneal after contact formation takes place at the same or a higher temperature than the preceding heating step.

Preferably the invention also includes a step of prebaking the substrate in an oxygen furnace at a temperature of between 500° C. and 1000° C. prior to performing the CVD deposition step.

The methods described above result in layered superlattice materials with good electronic properties, such as high polarizability. This is believed to be due to a crystalline orientation that results in good electronic properties. The poor electronic properties of the prior art are believed to have been due to the surface stress of the substrate; it is believed that the surface stress causes a relatively poor C-axis phase to form. It is believed that the process reduces according to the invention reduces such stress and results in more A-axis oriented grains, and a better crystal structure. Numerous other features, objects and advantages of the invention will become apparent from the following description when read in conjunction with the accompanying drawings.

DESCRIPTION OF THE PREFERRED EMBODIMENT

1. Overview

Figure 1:
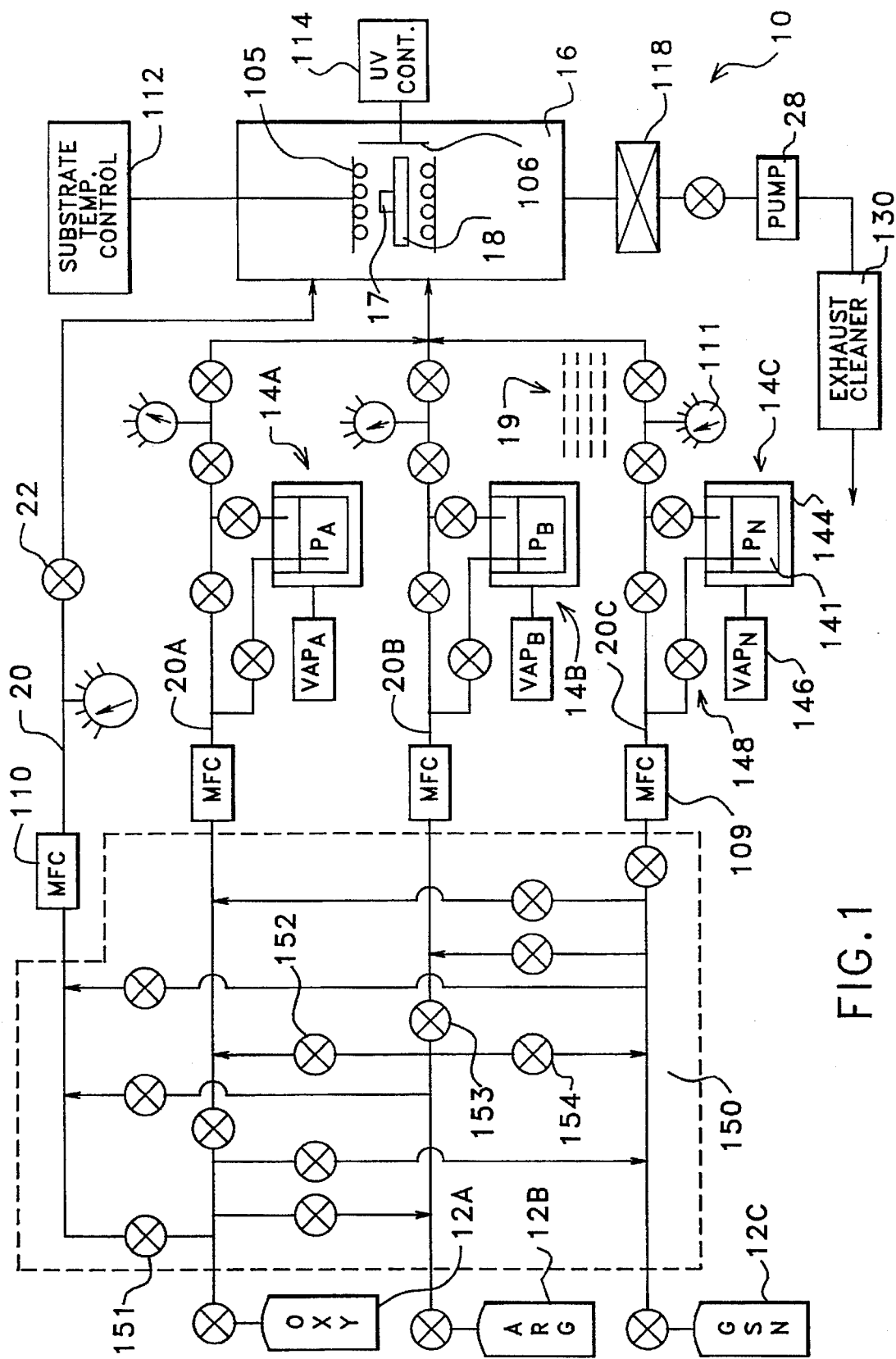
FIG. 1 is a block diagram of the preferred embodiment of the CVD system according to the invention.
Figures 2, 3:
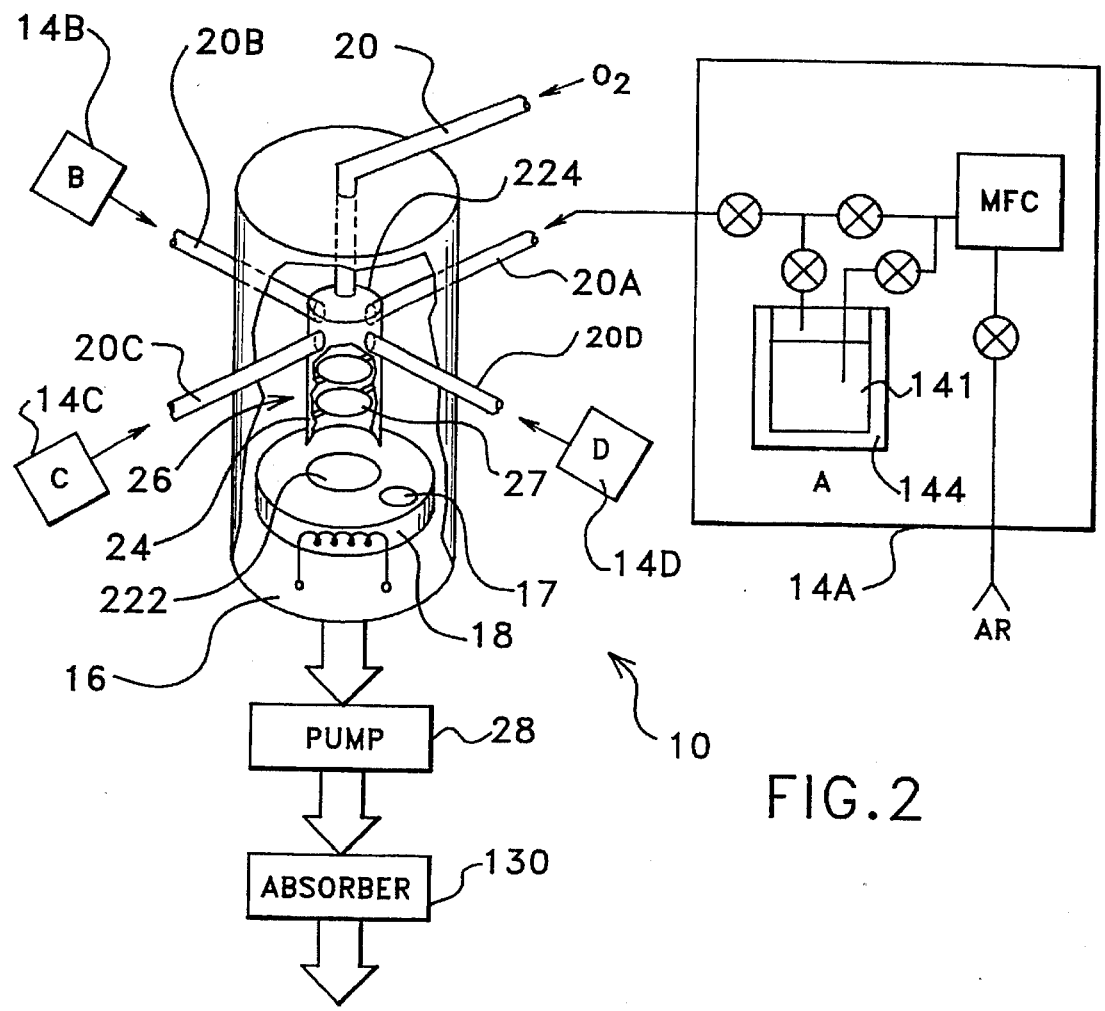
FIG. 2 is a schematic representation of the precursor vapor generators and CVD deposition chamber of the embodiment of FIG. 1 showing the preferred orientation of the components.
FIG. 3 is a cross-sectional view of an exemplary integrated circuit as may be fabricated by the process of the invention showing a memory cell of a non-volatile ferroelectric memory.
Figure 5:
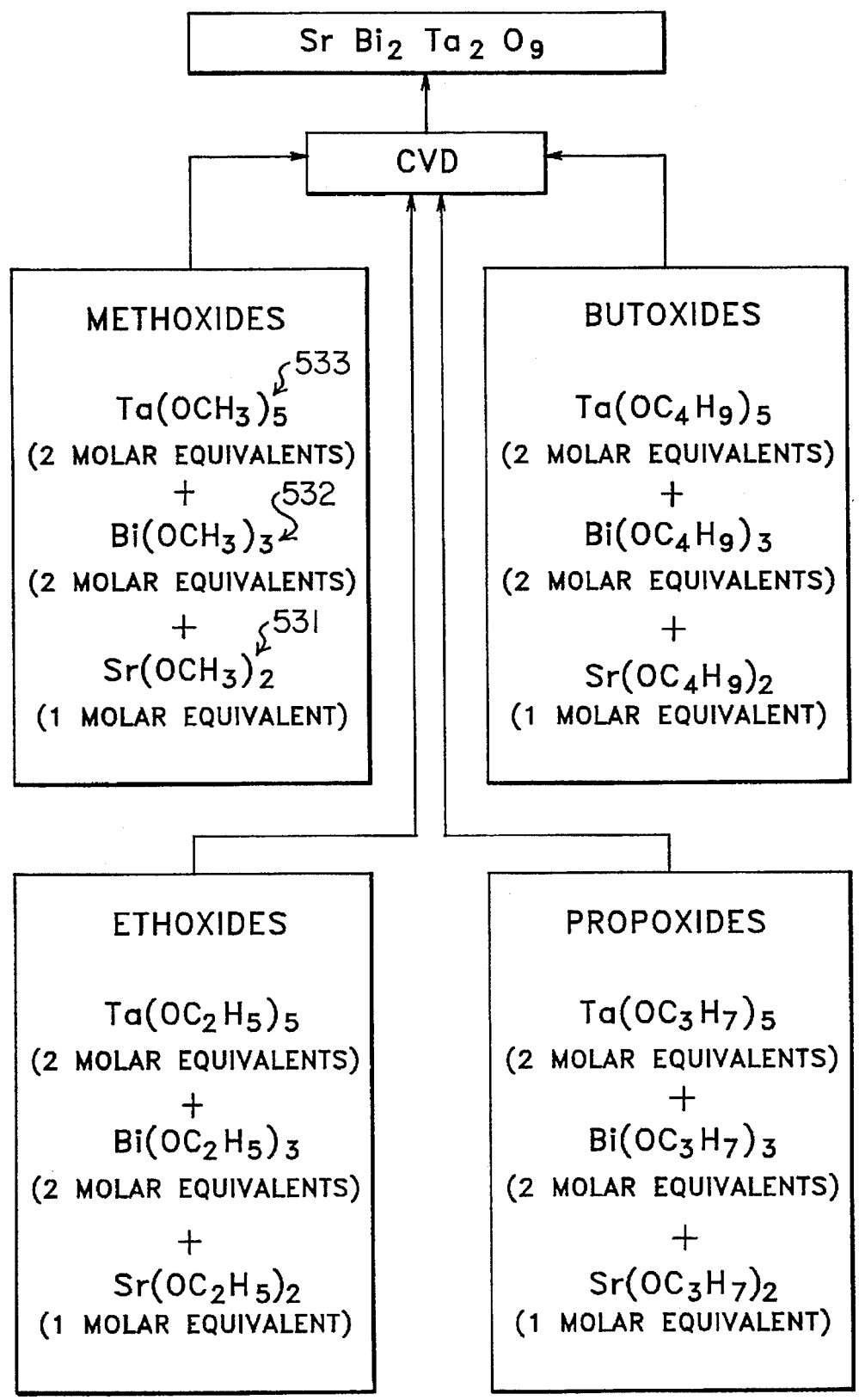
FIG. 5 is a diagram showing four alternative chemistries for the precursors used for CVD fabrication of strontium bismuth tantalate ($SrBi_2Ta_2O_9$)

Directing attention to FIG. 1, a block diagram of the preferred CVD system according to the invention is shown. The system 10 includes a plurality of gas sources, 12A, 12B, and 12C, a plurality of precursor vapor generators 14A, 14B, and 14C, and a CVD deposition chamber 16. Gas from sources 12A–12C passes through vapor generators 14A–14C to carry the vapor to chamber 16 where it is reacted as it comes in contact with a heated-substrate 17 on substrate holder 18. Although three gas sources 12A–12C and three vapor generators 14A–14C are shown, the system could include as few as two of each, or an additional number as suggested by the dotted lines 19. The gas sources 12A–12C, vapor generators 14A–14C, and deposition chamber are interconnected by conduits, such as 20, and valves, such as 22, so that gas from any one of sources 12A–12C can be directed to any of the vapor generators 14A–14C and the deposition chamber 16. As shown in FIG. 2, in the preferred CVD process argon from source 12B is directed to each of the vapor generators 14A–14C, while oxygen from source 12A is directed to deposition chamber 16. In FIG. 2, four vapor generators 14A–14D are shown. Further as shown in FIG. 2, the precursor vapor from the vapor generators 14A–14D enter a manifold 24 where they are mixed with oxygen by mixing mechanism 26, and drawn downward over and through the substrate holder 18 by exhaust pump 28. As indicated in FIG. 5, a typical layered superlattice thin film, strontium bismuth tantalate ($SrBi_2Ta_2O_9$), may be formed from three precursors: a strontium precursor 531, such as strontium methoxide [$Sr(OCH_3)_2$], a bismuth precursor 532, such as bismuth methoxide [$Bi(OCH_3)_3$], and a tantalum precursor 533, such as tantalum methoxide [$Ta(OCH_3)_5$].

FIG. 3 shows an example of the integration of a layered superlattice material 60 into a DRAM memory cell 50 to form an integrated circuit 70 such as may be fabricated using the invention. The memory cell 50 includes a silicon substrate 51, field oxide areas 54, and two electrically interconnected electrical devices: a transistor 71 and a ferroelectric switching capacitor 72. Transistor 71 includes a gate 73, a source 74, and a drain 75. Capacitor 72 includes first electrode 58, ferroelectric layered superlattice material 60, and second electrode 77. Insulators, such as 56, separate the devices 71, 72, except where drain 75 of transistor 71 is connected to first electrode 58 of capacitor 72. Electrical contacts, such as 47 and 78 make electrical connection to the devices 71, 72 to other parts of the integrated circuit 70. A detailed example of the complete fabrication process for an integrated circuit memory cell as shown in FIG. 3, except for the process of fabricating the layer 60, is given in U.S. patent application Ser. No. 07/919,186 now abandoned which is incorporated herein by reference. The process for fabricating the layer 60 is discussed herein. Typically the layer 60 is a thin film of thickness of between 200 Å and 5000 Å. It should be understood that FIG. 4 depicting the integrated circuit 70 is not meant to be an actual cross-sectional view of any particular portion of an actual electronic device, but is merely an idealized representation which is employed to more clearly and fully depict the structure and process of the invention than would otherwise be possible.

Figure 4:
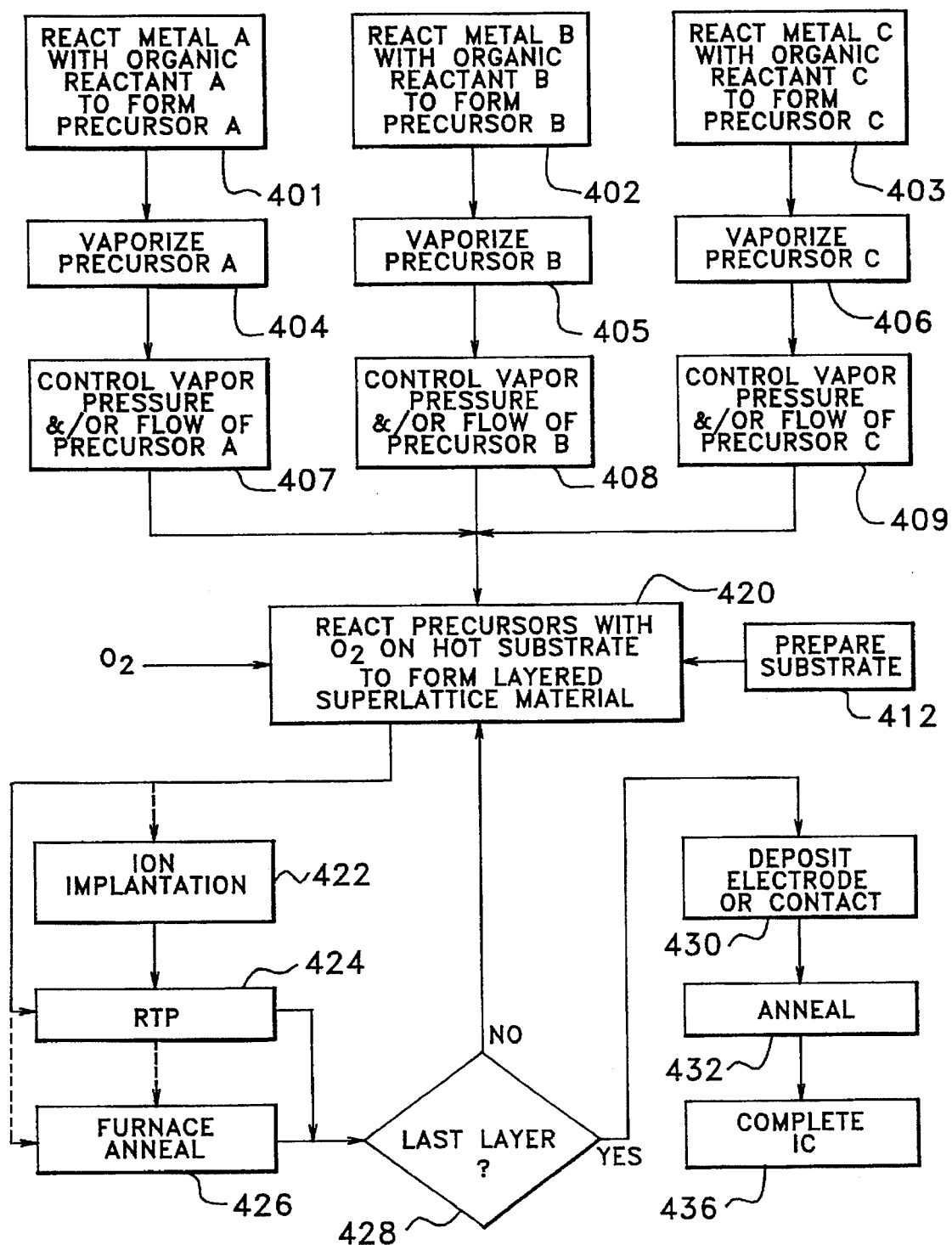
FIG. 4 is a flow chart showing the preferred embodiment of the CVD process according to the invention.

Turning to FIG. 4, a flow chart showing the process of the invention is shown. When the layered superlattice thin film 60 is formed in the CVD deposition step 420, it is either amorphous or polycrystalline. After formation in step 420, the film 60 is crystallized or recrystallized, preferably by an RTP step 424, and alternatively by a furnace anneal step 426. Optionally an ion implantation step 422 may be performed prior to the RTP step 424 to create crystallization sites. The term crystallization or recrystallization is used because if the film is amorphous after step 420, then the RTP process 424 is a crystallization process, but if the film is polycrystalline after step 420, the RTP process 424 is a recrystallization process. For simplicity, in the discussion hereinafter, including the claims, wherever the term "crystallization" is used, means both crystallization and recrystallization.

After the crystallization steps 422, 424 and 426, an electrode or contact 77 is deposited, the film and contact 77 are annealed in step 432, then the integrated circuit is completed by conventional processes. The term "electrode or contact" is used above because in the integrated circuit shown, the layer 77 adjacent layered superlattice thin film layer 60 is an electrode, but in other embodiments the term "contact" may be more appropriate, as for example when a wiring layer contacts the layered superlattice material directly. However, in their broadest meanings, the words "contact" and "electrode" are interchangeable, since electrode 77 also "contacts" the layered superlattice material 60. Hereinafter, for simplicity, the word "electrode" will be used when referring to this layer 77 through which electrical contact is made to layered superlattice layer 60, with the understanding that it means any such "electrode " or "contact".

It also should be noted that the invention contemplates that the layered superlattice material 60 may be either a ferroelectric or a dielectric material, or both. That is, while in the preferred embodiment the layered superlattice material 60 is a ferroelectric, in other embodiments it may be a dielectric, or both a ferroelectric and dielectric. If it is a dielectric only, the capacitor 72 is a dielectric capacitor, and the integrated circuit 70 is a volatile memory.

It should be understood that the specific processes and electronic devices described herein are exemplary; that is the invention contemplates that the layers in FIG. 3 may be made of many other materials than those mentioned above and described below, there are many other variations of the process of the invention than can be included in a document such as this, and the method and materials may be used in many other electronic devices other than the integrated circuit 70. It should also be noted that the word "substrate " is used in both a specific and a general sense in this disclosure. In the specific sense it refers to the specific silicon layer 51, conventionally called a silicon substrate, on which the exemplary electronic device 70 described is fabricated. In a general sense, it refers to any material, object, or layer on which another layer or layers are formed. In this sense, for example, the layers 51, 54, 56, and 58 comprise a substrate 17 for the layer 60 of layered superlattice material.

As used herein, the term stoichiometric generally expresses a relationship between the various elements that make up the desired final thin film 60. A "stoichiometric" thin film is one in which the relative proportions of the various elements in the thin film 60 are as given in the chemical formula for the material 60.

The crystallographic orientations of the layered superlattice materials are described herein in terms of a C-axis and an A-axis orientation. The C-axis is the crystal axis that passes through the planes of the alternating layers of the layered superlattice material. The A-axis is one of the four axes parallel to such planes. The definitions of the various axis, such as the A-axis and the C-axis, are known for layered superlattice materials. It is believed the good results of the process according to the invention arise from the fact that the process according to the invention yields grains oriented in a more mixed crystal phase rather than being predominately a phase that gives poor electronic properties. However, a complete crystallographic understanding of the layered superlattice materials made by the process of the invention has not yet been accomplished. Thus, it should be understood that while the process of the invention results in better electrical properties than the processes of the prior art, the reasons given herein for the good properties may change when a more complete crystallographic understanding of these materials is obtained.

2. Detailed Description of the Fabrication Process

Layered superlattice materials may be summarized more generally under the formula:

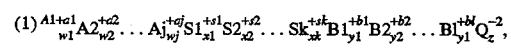

(1) $A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_{z}^{-2}$, where A1, A2 . . . A represent A-site elements in the perovskite-like structure, which may be elements such as strontium, calcium, barium, bismuth, lead, and others, S1, S2 . . . Sk represent super-lattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which may be elements such as oxygen, fluorine, chlorine and hybrids of these elements, such as the oxyfluorides, the oxychlorides, etc. In this disclosure we are primarily interested in the layered superlattice oxides, which include the materials in which Q is oxygen as well as the hybrids that include oxygen. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$(a1w1+a2W2 \ldots +ajwj)+(s1=1+s\,2+2 \ldots +skxk)+(b1y1+b2y2 \ldots +bjyj)=2z.$ (2)

The layered superlattice materials do not include every material that can be fit into the formula (1), but only those which spontaneously form themselves into crystalline structures with distinct alternating layers.

It should also be understood that the term layered superlattice material herein also includes doped layered superlattice materials. That is, any of the materials included in formula (1) may be doped with a variety of materials, such as silicon, germanium, uranium, zirconium, tin or hafnium. For example, strontium bismuth tantalate may be doped with a variety of elements as given by the formula:

$$(Sr_{1-x}M1_x)Bi_2(Nb_{1-y}M2_y)O_9+\alpha M3O, \quad (2)$$

where M1 may be Ca, Ba, Mg, or Pb, M2 may be Ta, Bi, or Sb, with x and y being a number between 0 and 1 and preferably $0 \leq x \leq 0.2, 0 \leq y \leq 0.2$, M3 may be Si, Ge, U, Zr, Sn, or Hf, and preferably $0 \leq \alpha \leq 0.1$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

$$(1-X) SrBi_2Ta_2O_9 + xABO_3, \quad (3)$$

where A may be Bi, Sr, Ca, Mg, Pb, Y, Ba, Sn, and Ln; B may be Ti, Zr, Hf, Mn, Ni, Fe, and Co; and x is a number between 0 and 1, preferably, $0 \leq x \leq 0.2$.

Likewise the layered superlattice material may be modified by both a minor $ABO_3$ component and a dopant. For example, a material according to the formula:

$$(1-x) SrBi_2Ta_2O_9 + xABO_3 + \alpha MeO, \quad (3)$$

where A may be Bi, Sb, Y and Ln; B may be Nb, Ta, and Bi; Me may be Si, Ge, U, Ti, Sn, and Zr; and x is a number between 0 and 1, preferably, $0 \leq x \leq 0.2$, is contemplated by the invention.

Turning now to FIG. 1, the preferred embodiment of the CVD system 10 according to the invention incudes a plurality of gas sources 12A–12C, a plurality of precursor vapor generators 14A–14C, mass flow controllers, such as 110, pressure gauges, such as 111, deposition chamber 16 enclosing substrate holder 18, heating unit 105, and UV source 106, substrate temperature controller 112 which controls electrical power to heating unit 105, UV controller 114, which controls the electrical power to UV source 106, cold trap 118 which traps most of the materials exhausted from chamber 16 before they reach pump 28, exhaust cleaner 130 which is preferably a gas absorber, conduits such as 20, preferably stainless steel tubing, for carrying the gases and vapors into and out of chamber 16, and numerous valves such as 22 which are used to control the flow of gas and vapor in the conduits, such as 20.

The gas sources preferably include an oxygen source 12A, an argon source 12B, and one or more sources 12C of other gases, such as dry nitrogen, which one or more sources are represented by gas source N. Each precursor vapor generator, such as 14C, includes a vapor unit 141 which is preferably a conventional bubbler, but may also be an ultrasonic vaporizer or other vaporizer, a heater 144, and a vapor pressure control unit 146 which controls the power to heater 144, a conduit 20C, a pressure gauge 111 for measuring the pressure in conduit 20C, and five valves 148 for controlling the flow of gas into and the flow of vapor out of vapor unit 141, and the flow of vapor and gas into deposition chamber 16. The valve array 150, indicated by the dotted lines, is arranged so that gas from any one of gas sources 12A–12C may be directed to anyone of conduits 20 and 20A–20C. In the preferred embodiment of the process of the invention, valves 151 through 154 are open so that oxygen flows into conduit 20 and argon flows into conduits 20A through 20C. The oxygen in conduit 20 flows directly into deposition chamber 16 when valve 22 is open, while the argon in conduits 20A–20C is directed through the precursor in the vaporizers, such as 141. Mass flow controllers, such as 110, on each of conduits 20 and 20A through 20C adjust the flow in each conduit so that the proper amount of oxygen and vapor enter chamber 16. The precursors to be reacted are placed in the vapor units, such as 14, and are indicated generally in FIG. 1 as $P_A$, $P_B$, and $P_N$, where N indicates the nth precursor. The precursors will depend on the layered superlattice material it is desired to deposit; specific examples will be discussed in detail below. In general, there will be a different precursor for each metal in the formula for the layered superlattice material, although on occasions a single precursor may include more than one metal. In general each different precursor will have a different vapor pressure. Thus, to get the desired proportions of vapor into chamber 16, each vapor unit 14A–14C will be heated to a different temperature, and the flow of gas to each of the vapor unit 14A–14C will be different. The temperature to which each of the vapor units, such as 14C, are heated are determined by its respective vapor pressure control unit, such as 146, while the flow of gas is determined by the respective mass flow controller, such as 109. Substrate heater 105 is preferably one or more infrared lamps, such as halogen lamps, though an electrical resistance heater or other heating element may also be used. UV source 106 is preferably a Danielson-type UV light source, but may be an Xe-Hg lamp or a UV laser, preferably tuned to a frequency that assists the reaction of the precursors. UV treatment is optional, and whether it is used depends on the precursor and material to be formed.

Turning to FIG. 2, a schematic of the CVD system 10 is shown that shows further details of the preferred system. Preferably, there are four precursor vapor generators 14A, 14B, 14C, and 14D. The deposition chamber 16 includes a manifold 24 which is in the shape of a hollow cylinder with the upper end 224 closed and the; lower end open and located just above substrate holder 18. Substrate holder 18 is a disc having a central axis 222 about which the holder 18 is rotated to provide high throughput and homogeneity. Conduits 20A through 20D are connected between vapor generators 14A through 14D, respectively, and the upper portion of manifold 24, and preferably are evenly spaced about the circumference of the cylinder at 90° intervals. The oxygen conduit 20 is connected to the upper end 224 of manifold 24. A mixing mechanism 26 comprising a set of vanes 27 is located within the middle portion of manifold 24. The vapor from each of precursor vapor generators 14A through 14D passes through the respective conduits 20A through 20D to manifold 24 where the vanes 26 cause it to swirl and mix with the oxygen as it moves down toward the substrate holder 18. The vapors react at the heated substrate 17, and form a film of layered superlattice material on the substrate. Pump 28 removes the undesired reaction by-products, principally organics, and any unreacted precursor and assists in the movement of precursor vapor into and through the manifold 24.

Turning now to FIG. 4, a flow chart of the preferred embodiment of a CVD process according to the invention for preparing a thin film of a layered superlattice material 60 is shown. The first steps 401–403 of the process involve the preparation of the precursor or precursors, $P_1, P_2, \ldots P_N$. The precursor is formed by reacting the metal with an organic reactant to form a metalorganic compound. In many cases the final organic precursor is readily available commercially. In other cases a commercially available intermediate compound of the metal may be reacted to form the desired precursor. In all cases the preferred precursors are metalorganic liquids. Specific examples will be discussed below. Often the steps 401–403 may include several stages which may be separated considerably in time. In the first stage the precursor may be dissolved in a suitable solvent and concentrated so as to provide a long shelf life. Just before use, the solvent may be distilled out. Or an intermediate compound of the metal that has a long shelve life may be prepared or purchased, and the final precursor formed by way of a reaction just prior to use. When the precursors are ready, they are transferred to the vapor units, such as 141 (FIG. 1) and are vaporized in steps 404–406 and the vapor pressure and flow adjusted in steps 407–409 to provide the proper amount of vapor to deposition chamber 16. As indicated above, the steps 404–409 are usually all done simultaneously, though they are shown separately in the drawing for ease of discussion.

In parallel with the steps 401–403 the substrate 17 is prepared. If the substrate is a metalized substrate, such as the substrate 17 in FIG. 3, then the substrate is prepared in step 412 by forming the layers 54, 56, and 58 on silicon wafer 51 and is then prebaked. The prebaking step comprises baking in an oxygen furnace, preferably at a temperature of between 500° C. and 1000° C. The substrate prebake removes water and organic impurities from the substrate surface and decreases the internal stress of the metal layer 58, thereby increasing the adhesion between the substrate 17 and the layered superlattice film 60. This prebake step is important for preparing electronic devices of high quality. If the substrate is a non-metallized substrate, such as a silicon or gallium arsenide single, crystal, the substrate is dehydrated in step 412.

In step 420 a layered superlattice material is deposited on the substrate by the CVD apparatus described above. Preferably the temperature of substrate 17 during deposition is between 400° C. and 800° C., the exact temperature depending on the material to be formed. The pressure in deposition chamber 16 is preferably between 1 torr and 850 torr. The vapor pressures of the individual precursor vapors depends on the precursor and will be discussed below in connection with the precursors.

The film formed in step 420 contains all the metal elements of the desired layered superlattice material, and generally contains most but not all of the oxygen necessary to form the final desired material. It also may contain other organics from the precursor. It may be in an amorphous form, in a partially crystallized form, or in a form with a different crystallization than the final form desired. It is believed that prior art CVD processes have tended to create crystals with a C-axis orientation, which results in relatively low polarizabilities and coercive fields. In steps 422 through 426 the film is treated to form the final desired layered superlattice material. Preferably the integrated circuit wafer 70 is removed from the deposition chamber before this treatment. This avoids the problem of possible contamination by materials on the walls of the chamber. The preferred treatment follows the solid lines in FIG. 4, while the dotted lines indicated alternative or optional treatments. The preferred treatment includes the step 424 of heating the integrated circuit wafer 70 in a RTP (rapid thermal processor) unit. Preferably the temperature is ramped over a range of from 1° C. per second to 300° C. per second and up to a temperature of from 500° C. to 850° C. for a holding period of from 5 seconds to 5 minutes. This results in relatively small average grain size of the order of from 20 to 200 nm and is believed to result in a mixed phase of C-axis and A-axis orientation of the grains, or a predominately A-axis orientated phase. The RTP step promotes nucleation, i.e. the generation of numerous small crystalline grains of the layered superlattice material of mixed orientation in the solid film 60. These grains act as nuclei upon which further crystallization can occur. In some cases, particularly when the C-axis orientation is excessive, an ion implantation step 422 is performed prior to the RTP bake step 424. The ion implantation step 422 preferable employs implantation with argon, helium, oxygen or similar ions. This step creates additional nuclei for growing grains with mixed orientation. Alternatively, an oxygen furnace anneal may be used in place of or in combination with the RTP step. Preferably the furnace anneal step 426 follows the RTP step, as the RTP step tends to create many sites for mixed crystal growth. The oxygen furnace anneal is particularly useful when the CVD formed film has significant oxygen deficiency. In addition to the advantages mentioned above, the steps 422 though 426 of treating the thin film 60 in general provide films of better stoichiometry than films that are not so treated.

In some cases, particularly when films of greater than 1000 Å are desired, the process of forming the thin film 60 is done in several layers. This ensures that the inner portions will also be predominately mixed phase rather than predominately C-axis orientation. In these cases the steps from 420 through 428 are repeated until the desired thickness is obtained. If the steps 420 through 428 are repeated, they may or may not be carried out in the same equipment. The electrode 77, or other contact layer in the case of other embodiments, is then formed by sputtering or other suitable process. Preferably the top or second electrode 77 is made of approximately 2000 Å of platinum. The integrated circuit wafer is then annealed in step 432. This anneal is preferably at the same or a higher temperature than the RTP step 424 and/or the furnace anneal step 426. Preferably in step 432 the anneal temperature is between 500° C. and 850° C. for a time period of 15 minutes or more minutes. Usually this anneal time is 120 minutes or less, but longer times are sometimes required. The anneal step 432 releases the internal stress in the top electrode 77 and in the interface between the electrode 77 and the layered superlattice material 60. At the same time, the annealing step 432 reconstructs microstructure in the layered superlattice material 60 resulting from the sputtering of the top electrode, and as a result improves the properties of the material. The effect is essentially the same whether the anneal 432 is performed before or after the patterning of the capacitor 72. The integrated circuit 70 is then completed in known processes in step 436.

As an example of the process of the invention, a substrate 17 is prebaked at 800° C. in a diffusion furnace for 30 minutes with an oxygen flow of 6 liters/min. Then a thin film 60 of strontium bismuth tantalate ($SrBi_2Ta_2O_9$) may be prepared using triphenyl bismuth ($BiPh_3$) as the bismuth precursor, $P_A$ in FIG. 1, at a partial pressure of about 5 torr in conduit 20A, dipivaloylmethanato strontium ($Sr[DPM]_2$) as the strontium precursor, $P_B$ in FIG. 1, at a partial pressure of about 50 torr in conduit 20B, and pentaethoxy tantalum ($Ta[OEt]_5$) as the tantalum precursor, $P_N$ in FIG. 1, at a partial pressure of about 5 torr in conduit 20C, with the substrate 17 at a temperature in the range given above, preferably at a lower temperature of about 500° C. After an RTP step 424 with a maximum temperature of 725° C. with a ramping rate of 125° C./sec, a hold time of 30 seconds, a natural cool time of 6 minutes, and an ambient oxygen flow of approximately 100–200 cc/minute, and an anneal step 436 at a temperature of 800° C. in an oxygen flow of about 6 l/min for 30 minutes a strontium bismuth tantalate (SrBi$_2$Ta$_2$O$_9$) film of good electrical properties with a final thickness of 2000 Å may be formed.

A feature of the invention is that many different possible precursors may be used. Some examples for strontium bismuth tantalate are shown in FIG. 5. Although precursors of the same families, e.g. methoxides, butoxides etc. are shown together in FIG. 5, this is not necessary. Sometimes the use of a methoxide, for example, for one metal and the use of a propoxide, for example, for another metal gives better results. Typical chemistry families that may be used as precursors are the alkoxides which include: methoxide [M(OCH$_3$)$_n$], ethoxide [M(OC$_2$H$_5$)$_n$], propoxide [M(OC$_3$H$_7$)$_n$], and butoxide [M(OC$_4$H$_9$)$_n$], where M is a metal and n is the number of alkoxyl bases combining with the metal and is equal to the valence of the metal. A polymerized alkoxide can also be used for the CVD source. A preferable length of the alkoxide polymer chain is between 1 and 5 monomer units. Other chemistry families that may be used are the beta-diketonates such as acetylacetonate with the formula:

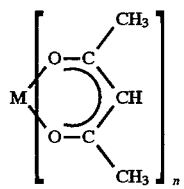

where M represents metal and n represents the number of monomers, and benzoilacetonate with the formula:

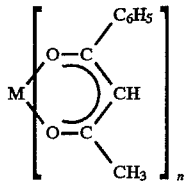

As indicated above the layered superlattice materials may include metals such as strontium, calcium, barium, bismuth, cadmium, lead, titanium, tantalum, hafnium, tungsten, niobium, zirconium, bismuth, scandium, yttrium, lanthanum and the lanthanides, antimony, chromium, molybdenum, vanadium, ruthenium and thallium. Some examples of precursors that may be used for some of these metals are given in Table I.

TABLE I

| METAL | PRECURSOR FORMULA | CHEMICAL NAME OR NAMES |
|---|---|---|
| Strontium | Sr(DPM)$_2$ | Dipivaloylmethanato strontium or Bis (2,2,6,6,-tetramethyl-3,5-heptanedionato)-strontium or |

TABLE I-continued

| METAL | PRECURSOR FORMULA | CHEMICAL NAME OR NAMES |
|---|---|---|
|  |  | strontium dipivaloylmethanate |
|  | Sr(Cp)$_2$(THF)$_2$ | Bis (pentamethyl-cyclopentadienyl)-bis (tetrahydrofran) strontium |
|  | Sr(DPM)$_2$(Phen)$_2$ | Bis (2,2,6,6,-tetramethyl-3,5-heptanedionato)-bis (1,10-phenanthroline) strontium |
| Bismuth | BiPh$_3$ | Triphenyl bismuth |
|  | Bi (OiPr)$_3$ | Triisopropoxy bismuth |
|  | Bi(DPM)$_3$ | Bismuth dipivaloylmethanate |
| Barium | Ba(DPM)$_2$ | Barium dipivaloylmethanate |
| Lead | Pb(DPM)$_2$ | lead dipivaloylmethanate |
|  | Pb(C$_2$H$_5$)$_2$ | Diethyl lead |
| Tantalum | Ta(OCH$_3$)$_5$ | Pentamethoxy tantalum |
|  | Ta(OC$_2$H$_5$)$_5$ | Pentaethoxy tantalum |
|  | Ta(OC$_3$H$_7$)$_5$ | Pentapropoxy tantalum |
|  | TaCl$_5$ | Pentachloro tantalum |
| Niobium | Nb(OC$_2$H$_5$)$_5$ | Pentaethoxy niobium |
|  | NbCl$_5$ | Pentachloro niobium |
|  | Nb(DPM)$_2$Cl$_3$ | Dipivaloylmethanato trichloro niobium |
| Antimony | Sb(OC$_2$H$_5$)$_3$ | Triethoxy antimony |
| Titanium | Ti(OiPr)$_2$(DPM)$_2$ | Diisopropoxy dipivaloylmethanato titanium |
|  | Ti(OiPr)$_4$ | Tetraisopropoxy titanium |
| Zirconium | Zr(DPM)$_4$ | Zirconium dipivaloylmethanate |
| Ruthenium | Ru(DPM)$_3$ | Ruthenium dipivaloylmethanate |

In Table I, DPM is C$_{11}$H$_{19}$O$_2$ usually called 2,2,6,6,-tetramethyl-3,5-heptanedione.

It is a feature of the invention that after depositing by CVD, the layered superlattice material is treated to crystallize it in a phase including more grains with a high polarizability orientation than prior to said step of treating. Here, a "high polarizability orientation" means that the grains are oriented in such a way that a field normal to the surface of the substrate will produce a higher polarizability than if the treatment had not been performed. As indicated above, the treatment may comprise, RTP, oxygen furnace annealing, ion implantation, a second anneal after the contact to the layered superlattice material is formed, or combinations thereof.

There has been described a CVD process for making electronic devices utilizing layered superlattice materials. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that prebaking of the substrate, RTP bake, and the anneal after the deposition of the contact layer 77 have been identified as important part of the CVD process for fabricating layered superlattice materials, these processes can be combined with other CVD processes to provide variations on the processes described. It is also evident that the steps recited may in some instances be performed in a different order. Or equivalent structures and process may be substituted for the various structures and processes described. Or a variety of different precursors may be used. Consequently, the invention is to be construed as embracing each and every novel feature and novel combination of features present in and/or possessed by the fabrication processes, electronic devices, and electronic device manufacturing methods described.

We claim:

1. A method of fabricating an integrated circuit including a ferroelectric layered superlattice material containing at least three different metals, said layered superlattice material having alternating ferroelectric and non-ferroelectric layers, said method comprising the steps of:

providing a substrate;

depositing on said substrate a film including said at least three different metals in effective amounts for yielding said layered superlattice material containing said at least three different metals, utilizing a chemical vapor deposition process; and heating said film to crystallize it into a layer of said layered superlattice material containing said at least three different metals in a phase having a higher polarizability than prior to said step of heating said layered superlattice material being less than 1 micron thick.

2. A method as in claim 1 wherein said step of heating comprises baking said film using a rapid thermal process (RTP) in which the temperature is ramped over a range of from 1° C. per second to 300° C. per second and up to a temperature of from 500° C. to 850° C. for a holding period of from 5 seconds to 5 minutes.

3. A method as in claim 1 wherein said step of heating includes annealing in an oxygen furnace.

4. A method as in claim 1 and further including the step of prebaking said substrate prior to said step of depositing.

5. A method as in claim 1 wherein said step of depositing comprises the steps of:

providing a precursor comprising a metal alkoxide including at least one of said metals;

vaporizing said precursor; and using said vaporized precursor in said chemical vapor deposition process.

6. A method as in claim 1 wherein said layered superlattice material comprises strontium bismuth tantalate.

7. A method as in claim 1 wherein said step of heating forms a mixed phase of C-axis oriented grains and A-axis oriented grains of said ferroelectric layered superlattice material.

8. A method as in claim 1 wherein said substrate comprises a silicon layer and an electrode, said electrode located between said silicon layer and said layer of said ferroelectric layered superlattice material.

9. A method as in claim 1 wherein said layered superlattice material includes a metal from a group consisting of strontium, calcium, barium, cadmium, lead, tantalum, hafnium, tungsten, niobium zirconium, bismuth, scandium, yttrium, lanthanum and the lanthanides, antimony, chromium, molybdenum, vanadium, ruthenium and thallium.

10. A method of fabricating an integrated circuit as in claim 1 and further including the step of:

prebaking said substrate in an oxygen furnace at a temperature of between 500° C. and 1000° C.

11. A method as in claim 10 wherein said layered superlattice material includes a metal from a group consisting of strontium, calcium, barium, cadmium, lead, tantalum, hafnium, tungsten, niobium zirconium, bismuth, scandium, yttrium, lanthanum and the lanthanides, antimony, chromium, molybdenum, vanadium, ruthenium and thallium.

12. A method of fabricating an integrated circuit including ferroelectric layered superlattice material containing at least three different metals, said layered superlattice material having alternative ferroelectric and non-ferroelectric layers, said method comprising the steps of:

providing a substrate;

depositing on said substrate a film including said at least three different metals in effective amounts for yielding said layered superlattice material containing said at least three metals, utilizing a chemical vapor deposition process;

forming an electrode on said film; and annealing said film and said electrode in an oxygen furnace, to form a thin film of said ferroelectric layered superlattice material containing said at least three different metals, said ferroelectric layered superlattice material being less than one micron thick between said substrate and said electrode.

13. A method as in claim 12 and further including the step of baking said film using a rapid thermal process (RTP) prior to said step of forming an electrode, said rapid thermal process being a process in which temperature is ramped over a range of from 1° C. per second to 300° C. per second and to an upper temperature of from 500° C. to 850° C. for a holding period of from 5 seconds to 5 minutes.

14. A method of fabricating an integrated circuit including a ferroelectric layered superlattice material containing at least three different metals, said layered superlattice material having alternating ferroelectric and non-ferroelectric layers, said method comprising the steps of:

providing a substrate;

depositing a thin film on said substrate utilizing a chemical vapor deposition process, said thin film including said at least three different metals in effective amounts for yielding said ferroelectric layered superlattice material having the formula $A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_z^{-2}$, where $A1, A2 \ldots Aj$ represent A-site elements in a perovskite-like structure, $S1, S2 \ldots Sk$ represent superlattice generator elements, $B1, B2 \ldots Bl$ represent B-site elements in said perovskite-like structure, Q represents an anion, the superscripts indicate valences of the respective elements, the subscripts indicate an average number of atoms of the element in the unit cell, and at least w1 and y1 are non-zero, and wherein said A-site element comprises one or more elements from a group consisting of strontium, calcium, barium, and lead, said B-site element comprises one or more elements from a group consisting of titanium, tantalum, hafnium, tungsten, niobium zirconium, said superlattice generator element comprises one or more elements from a group consisting of bismuth, scandium, yttrium, lanthanum, antimony, chromium, and thallium, and said anion comprises an element from a group consisting of oxygen, fluorine, chlorine and hybrids thereof; and heating said thin film to crystallize it into a layer of said layered superlattice material less than 1 micron thick.

15. A method as in claim 14 wherein said step of depositing comprises the steps of:

providing a precursor comprising a metal alkoxide including at least one of said metals;

vaporizing said precursor; and using said vaporized precursor in said chemical vapor deposition process.

16. A method as in claim 15 wherein said layered superlattice material comprises strontium bismuth tantalate.

* * * * *